United States Patent
Chan

(10) Patent No.: US 9,196,567 B1
(45) Date of Patent: Nov. 24, 2015

(54) PAD STRUCTURE

(71) Applicant: MACRONIX International Co., Ltd., Hsinchu (TW)

(72) Inventor: Yao-Fu Chan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/597,099

(22) Filed: Jan. 14, 2015

(51) Int. Cl.
*H01L 23/528* (2006.01)
*H01L 23/48* (2006.01)
*H01L 23/522* (2006.01)
*H01L 21/8229* (2006.01)

(52) U.S. Cl.
CPC ............ *H01L 23/48* (2013.01); *H01L 23/5221* (2013.01); *H01L 21/8229* (2013.01); *H01L 23/528* (2013.01)

(58) Field of Classification Search
CPC .............. H01L 23/5221; H01L 23/528; H01L 21/8229
USPC ........................................................ 257/758
See application file for complete search history.

(56) References Cited

U.S. PATENT DOCUMENTS

| | | | | |
|---|---|---|---|---|
| 7,276,437 B2* | 10/2007 | Yano | ....................... | H01L 24/49 257/E21.509 |
| 8,405,142 B2 | 3/2013 | Katsumata et al. | | |
| 8,541,819 B1* | 9/2013 | Or-Bach | ............. | H01L 29/7841 257/211 |
| 2010/0207240 A1* | 8/2010 | Hashimoto | ....... | H01L 27/11582 257/532 |
| 2011/0001178 A1* | 1/2011 | Iwase | ................ | H01L 21/28282 257/315 |
| 2011/0031630 A1* | 2/2011 | Hashimoto | ....... | H01L 27/11582 257/774 |
| 2011/0232214 A1* | 9/2011 | Lin | ...................... | E04F 11/0201 52/188 |
| 2011/0316069 A1* | 12/2011 | Tanaka | .............. | H01L 27/11526 257/324 |
| 2015/0024587 A1* | 1/2015 | Kim | ................... | H01L 27/11548 438/618 |
| 2015/0069499 A1* | 3/2015 | Nakaki | ............. | H01L 27/11582 257/326 |
| 2015/0214242 A1* | 7/2015 | Lee | ................... | H01L 27/11582 257/314 |
| 2015/0228623 A1* | 8/2015 | Oh | ....................... | H01L 25/0657 257/4 |
| 2015/0236037 A1* | 8/2015 | Choi | ................. | H01L 27/11573 438/301 |
| 2015/0255386 A1* | 9/2015 | Lee | ..................... | H01L 23/5226 257/774 |
| 2015/0255484 A1* | 9/2015 | Imamura | ........... | H01L 27/11582 257/314 |
| 2015/0263021 A1* | 9/2015 | Hwang | ............. | H01L 27/11529 257/321 |

\* cited by examiner

*Primary Examiner* — George Fourson, III
(74) *Attorney, Agent, or Firm* — J.C. Patents

(57) ABSTRACT

A pad structure including a plurality of staircase structures is provided. The staircase structures are disposed on the substrate. Each of the staircase structures includes a plurality of conductor layers and a plurality of dielectric layers that are alternately stacked. Two adjacent staircase structures are connected with each other by sharing the conductor layers and the dielectric layers and are arranged in parallel along a first direction. One of the two adjacent staircase structures includes at least one staircase portion that gradually decreases in height along a second direction, and the other of the two adjacent staircase structures includes at least one staircase portion that gradually decreases in height along a direction opposite to the second direction.

10 Claims, 2 Drawing Sheets

PAD STRUCTURE

BACKGROUND OF THE INVENTION

1. Field of the Invention

The invention relates to a pad structure, and particularly relates to a pad structure having a staircase structure.

2. Description of Related Art

For the purposes of high density and high performance, seeking further developments in the three-dimensional space within a limited unit area has now become the trend as the semiconductor devices are integrated. Conventional three-dimensional semiconductor devices, such as NAND flash memory of the non-volatile memory, include a vertical memory array where a plurality of memory cells are arranged.

Taking the three-dimensional non-volatile memory as an example, even though the three-dimensional semiconductor devices have an increased memory capacity within the unit area, the structure of vertical memory array makes it more difficult to electrically connect memory cells at different layers with an external part. Thus, how to electrically connect the memory cells in the three-dimensional non-volatile memory with the external part while keeping the unit area minimized is an issue for researchers to work on.

SUMMARY OF THE INVENTION

The invention provides a pad structure capable of reducing the area that the pad structure requires in the three-dimensional semiconductor device.

The invention provides a pad structure including a plurality of staircase structures. The staircase structures are disposed on the substrate. Each of the staircase structures includes a plurality of conductor layers and a plurality of dielectric layers that are alternately stacked. Two adjacent staircase structures are connected with each other by sharing the conductor layers and the dielectric layers and are arranged in parallel along a first direction. One of the two adjacent staircase structures includes at least one staircase portion that gradually decreases in height along a second direction, and the other of the two adjacent staircase structures includes at least one staircase portion that gradually decreases in height along a direction opposite to the second direction.

According to an embodiment of the invention, in the pad structure, a height of a lowest stair in one of the two adjacent staircase structures is higher than a height of a highest stair in the other of the two adjacent staircase structures, for example.

According to an embodiment of the invention, in the pad structure, the lowest stair of one of the two adjacent staircase structures and the highest stair of the other of the two adjacent staircase structures may form a connection portion. A height of the connection portion gradually decreases along the first direction.

According to an embodiment of the invention, in the pad structure, the staircase portions of the two adjacent staircase structures may form a continuous staircase with the connection portion.

According to an embodiment of the invention, in the pad structure, the number of layers of the conductor layers of one of the two adjacent staircase structures is greater than the number of layers of the conductor layers of the other of the two adjacent staircase structures, for example.

According to an embodiment of the invention, in the pad structure, the second direction is orthogonal to the first direction, for example.

According to an embodiment of the invention, in the pad structure, a portion of the conductor layers of each of the staircase structures may have an exposed surface. Areas of the exposed surfaces gradually increase, gradually decrease or maintain the same area size as the height of the staircase portion decreases, for example.

According to an embodiment of the invention, in the pad structure, each of the staircase structures includes two staircase portions. A height of one of the staircase portions gradually decreases along the second direction, for example, and a height of the other of the staircase portions gradually decreases along the direction opposite to the second direction, for example.

According to an embodiment of the invention, in the pad structure, a height of a lowest stair of one of the staircase portions is higher than a height of a highest stair of the other of the staircase portions, for example.

According to an embodiment of the invention, in the pad structure, the conductor layers of two adjacent stairs in the staircase portion are electrically isolated by the dielectric layer.

Based on the above, since the pad structure of the invention has the staircase structure, the device connected to each stair in the three dimensional space is easily connected to an external part. In addition, two adjacent staircase structures have the staircase portions that gradually decrease in height in opposite directions. Therefore, more devices are contained in the same unit area, and the are that the pad structure requires in the three-dimensional semiconductor device is significantly reduced. Thus, high density and high performance are achieved.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
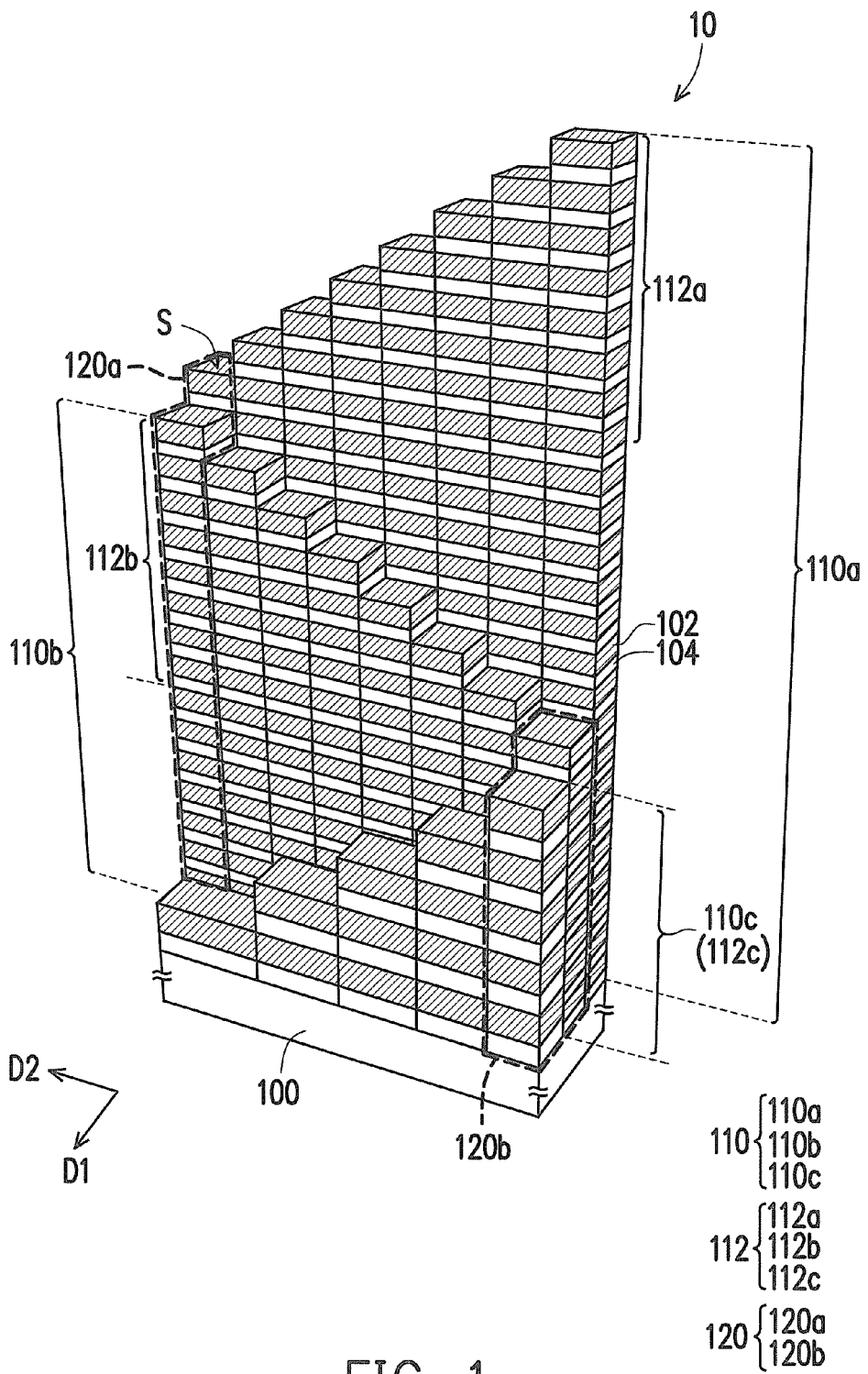
FIG. 1 is a schematic perspective view illustrating a pad structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic perspective view illustrating a pad structure according to an embodiment of the invention.

Referring to FIG. 1, a pad structure 10 includes a plurality of staircase structures 110. In this embodiment, the pad structure 10 may include three staircase structures 110, such as staircase structures 110a, 110b, and 110c shown in FIG. 1. The staircase structures 110a, 110b, and 110c are respectively arranged in parallel along a first direction D1.

The staircase structures 110 may be disposed on the substrate 100. The substrate 100 is, for example, a silicon substrate. The staircase structures 110 include a plurality of conductor layers 102 and a plurality of dielectric layers 104 that are alternately stacked. In this embodiment, the dielectric layer 104 is located on the substrate 100, and the conductor layer 102 is located on the dielectric layer 104. However, the invention is not limited thereto.

A material of the conductor layer 102 includes a conductor or a doped semiconductor. The conductor layer 102 is formed of a metal material, N+ doped polysilicon, P+ doped polysilicon, or a combination thereof, for example. A method of forming the conductor layer 102 includes performing a physical vapor deposition process or a chemical vapor deposition process, for example. The conductor layer 102 may be a word line in a memory or an interconnect structure for connecting a memory cell and a bit line. However, the invention is not limited thereto. People having ordinary skills in the art may adjust the use of the conductor layer 102 according to the design requirements of the product.

The number of layers of the conductor layers 102 of one of two adjacent staircase structures 110 is greater than the number of layers the conductor layers 102 of the other of the two adjacent staircase structures 110. In this embodiment, the number of layers of the conductor layers 102 of the staircase structure 110a is greater than the number of layers of the conductor layers 102 of the staircase structure 110b, and the number of layers of the conductor layers 102 of the staircase structure 110b is greater than the number of layers of the conductor layers 102 of the staircase structure 110c. In other words, the number of layers of the conductor layers 102 of the staircase structures 110 gradually decreases along the first direction D1. However, in another embodiment, the number of layers of the conductor layers 102 of the staircase structures 110 may also gradually increase along the first direction D1.

A material of the dielectric layer 104 may include a dielectric material such as oxide, nitride, or oxynitride, etc. A method of forming the dielectric layer 104 includes performing a thermal oxidation process or a chemical vapor deposition process.

It should be noted that two adjacent staircase structures 110 are connected to each other by sharing the conductor layers 102 and the dielectric layers 104. In this embodiment, the staircase structure 110a and the staircase structure 110b are connected to each other along the first direction D1 by sharing the conductor layers 102 and the dielectric layers 104. In other words, the staircase structures 110a, 110b, and 110c in the pad structure 10 are connected to each other by sharing the conductor layers 102 and the dielectric layers 104.

Referring to FIG. 1 again, each of the staircase structures 110 includes at least one staircase portion 112. In this embodiment, the staircase structure 110a includes a staircase portion 112a, the staircase structure 110b includes a staircase portion 112b, and the staircase structure 110c includes a staircase portion 112c. Each stair in the staircase portion 112 at least includes one conductor layer 102 and one dielectric layer 104. However, the invention is not limited thereto. The conductor layers 102 in two adjacent stairs may be electrically isolated by the dielectric layer 104. Also, in the staircase portion 112 of each of the staircase structures 110, a portion of the conductor layers 102 has an exposed surface S. The exposed surface S may be electrically connected to a conductive wire through a contact (not shown), for example. The exposed surfaces S in the staircase structures 110 may have the same area size, such as those in the staircase structures 110a and 110b. Also, the area of the exposed surfaces S in the staircase structure 110 may also gradually increase as a height of the staircase portion 112 decreases, such as the staircase structure 110c. In other words, the area of the exposed surface S of the lower conductive layer 102 in two adjacent stairs is greater than the area of the exposed surface S of the upper conductive layer 102, so as to enable the contact to connect with the exposed surface S having a greater depth. In other embodiments, the exposed surfaces S of the staircase structure 110 may gradually decrease as the height of the staircase portion 112 decreases. People having ordinary skills in the art may adjust the area size of the exposed surface S in the staircase structure 110 according to the requirements of manufacturing processes.

Two adjacent staircase structures 110 have the staircase portions 112 that gradually decrease in height in opposite directions. In this embodiment, the staircase structure 110a includes the staircase portion 112a that gradually decreases in height along a second direction D2, while the staircase structure 110b includes the staircase portion 112b that gradually decreases in height in a direction opposite to the second direction D2. In addition, the staircase structure 110c includes the staircase portion 112c that gradually decreases in height along the second direction D2. In other words, the adjacent staircase structures 110a and 110b have the staircase portions 112a and 112b that gradually decrease in height in opposite directions, and the adjacent staircase structures 110b and 110c have the staircase portions 112b and 112c that gradually decrease in height in opposite directions. The second direction D2 is different from the first direction D1. The second direction D2 is orthogonal to the first direction D1, for example.

A height of a lowest stair in one of two adjacent staircase structures 110 is higher than a height of a highest stair of the other of the two adjacent staircase structures 110, for example. In this embodiment, the height of the lowest stair of the staircase structure 110a is higher than the height of the highest stair of the staircase structure 110b, for example, and the height of the lowest stair of the staircase structure 110b is higher than the height of the highest stair of the staircase structure 110c, for example.

The lowest stair in one of two adjacent staircase structures 110 and the highest stair in the other of the two adjacent staircase structures 110 form a connection portion 120, and a height of the connection portion 120 gradually decreases along the first direction D1, for example. In this embodiment, the lowest stair of the staircase structure 110a and the highest stair of the staircase structure 110b form a connection portion 120a, and the lowest stair of the staircase structure 110b and the highest stair of the staircase structure 110c form a connection portion 120b. In addition, the staircase portions 112 of two adjacent staircase structures 110 form a continuous staircase with the connection portions 120. In this embodiment, the staircase portion 112a of the staircase structure 110a and the staircase portion 112b of the staircase structure 110b form a continuous staircase through the connection portion 120a, and the staircase portion 112b of the staircase structure 110b and the staircase portion 112c of the staircase structure 110c form a continuous staircase through the connection portion 120b.

In this embodiment, even though the pad structure 10 is described to have three staircase structures 110 as an example, the invention is not limited thereto. In another embodiment, the pad structure 10 may also include two staircase structures 110 (e.g. the staircase structures 110a and 110b or the staircase structures 110b and 110c) or four or more staircase structures 110. People having ordinary skills in the art may adjust the number of the staircase structures 110 according to the design requirements of the product. Also, the pad structure 10 may be configured to connect a variety of semiconductor devices with an external part. For example, the pad structure 10 may connect a memory device with an external power or other external signals.

Based on this embodiment, it can be known that since the pad structure 10 has the staircase structures 110, in a three-dimensional space, a device connected to each stair may be easily connected to an external part. Besides, since two adjacent staircase structures 110 have the staircase portions 112 that gradually decrease in height in opposite directions, the pad structure 10 of this embodiment is capable of containing more devices in the same unit area and significantly reducing area that the pad structure 10 requires in a three-dimensional semiconductor device, as compared with a conventional pad.

Moreover, in the pad structure 10 shown in FIG. 1, each of the staircase structures 110 includes only one staircase portion 112. However, the pad structure 10 is only described for an illustrative purpose, and the invention is not limited thereto. In other embodiments, the staircase structures 110 may respectively include one or two or more staircase portions 112. Details in this respect are described in the following.

Figure 2:
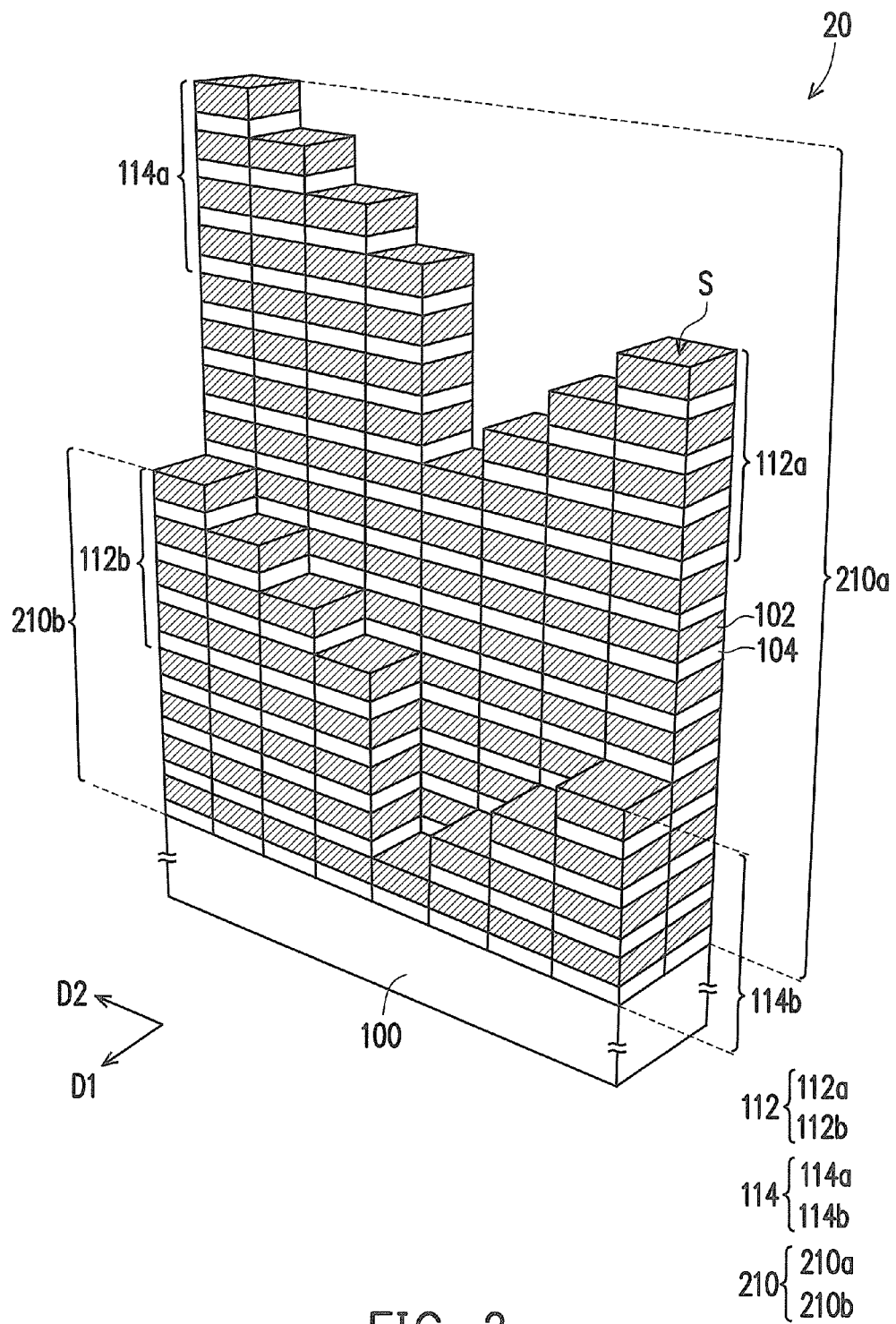
FIG. 2 is a schematic perspective view illustrating a pad structure according to another embodiment of the invention.

FIG. 2 is a schematic perspective view illustrating a pad structure according to another embodiment of the invention.

Referring to FIG. 2, a pad structure 20 shown in FIG. 2 differs from the pad structure 10 shown in FIG. 1 in the following way. Each staircase structure 210 in FIG. 2 has two staircase portions (i.e. the staircase portions 112 and 114), while each staircase structure 110 in FIG. 1 has only one staircase portion (i.e. the staircase portion 112). Namely, the number of staircase portions that each staircase structure 210 has and the number of staircase portions that each staircase structure 110 has are different. Other identical components are referred to by identical reference numerals, and are not reiterated in the following.

The pad structure 20 has a plurality of the staircase structures 210. In this embodiment, the staircase pad structure 20 is described to include two staircase structures 210, such as a staircase structure 210a and a staircase structure 210b shown in FIG. 2, as an example. In other embodiments, the number of the staircase structures 210 of the pad structure 20 may also be three or more.

Each of the staircase structures 210 includes the staircase portions 112 and 114. For example, the staircase structure 210a includes the staircase portion 112a and a staircase portion 114a, and the staircase structure 210b includes the staircase portion 112b and a staircase portion 114b. In this embodiment, even though each of the staircase structures 210 is described to have two staircase portions as an example. However, the invention is not limited thereto. In other embodiments, each staircase structure 210 may have three or more staircase portions.

In each of the staircase structures 210, one of the staircase portions 112 and 114 gradually decreases in height along the second direction D2, and the other of the staircase portions 112 and 114 gradually decreases in height along the direction opposite to the second direction D2. In the staircase structure 210a, a height of the staircase portion 112a gradually decreases along the second direction D2, for example, and a height of the staircase portion 114a gradually decreases along the direction opposite to the second direction D2, for example. In addition, in the staircase structure 210b, a height of the staircase portion 114b gradually decreases along the second direction D2, for example, and a height of the staircase portion 112b gradually decreases along the direction opposite to the second direction D2, for example.

Based on the above embodiment, it can be known that since the adjacent staircase structures 210a and 210b respectively have the staircase portions 112a and 112b or the staircase portions 114a and 114b that gradually decrease in opposite directions, the pad structure 20 of this embodiment is capable of containing more devices in the same unit area and significantly reducing area that the pad structure 20 requires in a three-dimensional semiconductor device, as compared with a conventional pad.

In the embodiments, the pad structures 10 and 20 are described as examples, and the invention is not limited thereto. In other words, the invention covers any pad structure having two adjacent staircase structures with staircase portions that gradually decrease in height in opposite directions.

In view of the foregoing, since the pad structure of the embodiments has the staircase structure, the device connected to each stair in the three dimensional space is easily connected to an external part. In addition, two adjacent staircase structures respectively have the staircase portions that gradually decrease in height in opposite directions. Therefore, more devices are contained in the same unit area, and the area that the pad structure requires in the three-dimensional semiconductor device is significantly reduced. Thus, high density and high performance are achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pad structure, comprising:
a plurality of staircase structures, disposed on a substrate, wherein each of the staircase structures comprises a plurality of conductor layers and a plurality of dielectric layers that are alternately stacked, and two adjacent staircase structures are connected with each other by sharing the conductor layers and the dielectric layers and are arranged in parallel along a first direction, wherein
one of the two adjacent staircase structures comprises at least one staircase portion that gradually decreases in height along a second direction, and
the other of the two adjacent staircase structures comprises at least one staircase portion that gradually decreases in height along a direction opposite to the second direction.

2. The pad structure as claimed in claim 1, wherein a height of a lowest stair in one of the two adjacent staircase structures is higher than a height of a highest stair in the other of the two adjacent staircase structures.

3. The pad structure as claimed in claim 2, wherein the lowest stair of one of the two adjacent staircase structures and the highest stair of the other of the two adjacent staircase structures form a connection portion, and a height of the connection portion gradually decreases along the first direction.

4. The pad structure as claimed in claim 3, wherein the at least one staircase portions of the two adjacent staircase structures form a continuous staircase with the connection portion.

5. The pad structure as claimed in claim 1, wherein the number of layers of the conductor layers of one of the two adjacent staircase structures is greater than the number of layers of the conductor layers of the other of the two adjacent staircase structures.

6. The pad structure as claimed in claim 1, wherein the second direction is orthogonal to the first direction.

7. The pad structure as claimed in claim 1, wherein a portion of the conductor layers of each of the staircase structures has an exposed surface, and areas of the exposed surfaces gradually increase, gradually decrease or maintain the same area size as a height of the at least one staircase portion decreases.

8. The pad structure as claimed in claim 1, wherein each of the staircase structures comprises two staircase portions, wherein
- a height of one of the staircase portions gradually decreases along the second direction, and
- a height of the other of the staircase portions gradually decreases along the direction opposite to the second direction.

9. The pad structure as claimed in claim 8, wherein a height of a lowest stair of one of the staircase portions is higher than a height of a highest stair of the other of the staircase portions.

10. The pad structure as claimed in claim 1, wherein the conductor layers of two adjacent stairs in the at least one staircase portion are electrically isolated by the dielectric layer.

\* \* \* \* \*